(12) United States Patent
Xie et al.

(10) Patent No.: US 11,264,410 B2
(45) Date of Patent: Mar. 1, 2022

(54) DISPLAY DEVICE, DISPLAY PANEL AND MANUFACTURING METHOD THEREOF

(71) Applicants: Chengdu BOE Optoelectronics Technology Co., Ltd., Chengdu (CN); BOE TECHNOLOGY GROUP CO., LTD., Beijing (CN)

(72) Inventors: Chunyan Xie, Beijing (CN); Kuo Sun, Beijing (CN); Renrong Gai, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 77 days.

(21) Appl. No.: 16/811,324

(22) Filed: Mar. 6, 2020

(65) Prior Publication Data

US 2021/0005641 A1    Jan. 7, 2021

(30) Foreign Application Priority Data

Jul. 4, 2019  (CN) .......................... 201910600353.8

(51) Int. Cl.
*H01L 27/12* (2006.01)
*H01L 21/027* (2006.01)

(52) U.S. Cl.
CPC ...... *H01L 27/1248* (2013.01); *H01L 21/0274* (2013.01); *H01L 27/1259* (2013.01)

(58) Field of Classification Search
CPC ............. H01L 27/1259; H01L 27/1248; H01L 27/1218; H01L 21/0274; H01L 51/5237;
(Continued)

(56) References Cited

U.S. PATENT DOCUMENTS

2016/0013436 A1* 1/2016 Im .................... H01L 51/0017
                                                       257/40
2017/0031323 A1* 2/2017 Kim ................. H01L 27/3258
(Continued)

FOREIGN PATENT DOCUMENTS

CN   106887523       6/2017
CN   109473460 A     3/2019
CN   109742117 A     5/2019

OTHER PUBLICATIONS

First Office Action for CN Patent Application No. 201910600353.8 dated Dec. 30, 2020.

*Primary Examiner* — Mouloucoulaye Inoussa
(74) *Attorney, Agent, or Firm* — Thomas | Horstemeyer, LLP

(57) ABSTRACT

The present disclosure relates to a display panel that includes: a separation layer disposed on a surface of a planarization layer facing away from a substrate in a transition area, and surrounds at least a part of an opening area of the substrate in a circumferential direction of the opening area, and a sidewall of the separation layer gradually is shrunk toward the substrate in a direction perpendicular to the substrate; and a barrier layer located in the transition area and at least covers a surface of the barrier layer facing away from the substrate. The barrier layer includes a material for blocking moisture and oxygen. The display layer covers the planarization layer and the barrier layer. The display layer includes a light-emitting layer, and the light-emitting layer is discontinuous at a sidewall position of the separation layer.

20 Claims, 4 Drawing Sheets

(58) Field of Classification Search
CPC ............. H01L 27/3276; H01L 51/5253; H01L
27/3272; H01L 51/52; H01L 27/3244;
H01L 27/3246; H01L 51/5256; H01L
51/5246; H01L 51/5228; H01L 51/0096;
H01L 51/5044; H01L 27/3209; H01L
51/5206; H01L 51/56; H01L 27/323;
H01L 27/3248; H01L 27/3288; G06F
3/044; G06F 3/0443; G06F 3/0412; G06F
3/0446; Y02P 70/50; Y02E 10/549; G09G
3/3233
USPC ...................... 257/40, 99, 59; 438/34, 22, 23
See application file for complete search history.

(56) References Cited

U.S. PATENT DOCUMENTS

| | | | |
|---|---|---|---|
| 2018/0069063 A1* | 3/2018 | Kim ..................... | H01L 27/326 |
| 2018/0254429 A1* | 9/2018 | Lee ..................... | H01L 51/0014 |
| 2019/0245015 A1* | 8/2019 | Lee ..................... | H01L 51/5246 |
| 2020/0203469 A1* | 6/2020 | Li ....................... | H01L 27/3279 |

* cited by examiner

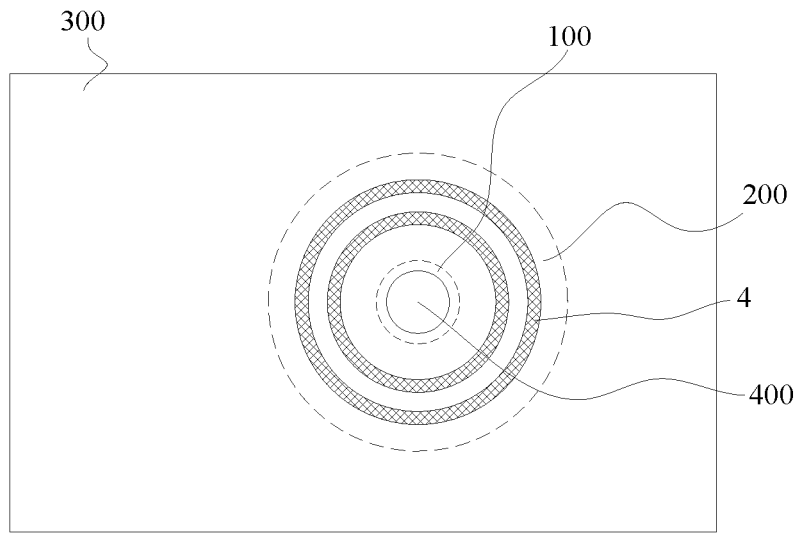

FIG. 3

| Provide a substrate having a transition area and an opening area and a display area separated on both sides of the transition area | S110 |

| Dispose a driving layer on one side of the substrate, the driving layer covering the opening region, the transition region, and the display region | S120 |

| Dispose a planarization layer covering the driving layer | S130 |

| Dispose a separation layer on a surface of the planarization layer facing away from the substrate and located in the transition area, a sidewall of the separation layer gradually shrinking toward the substrate in a direction perpendicular to the substrate, and surrounding at least a part of the opening area along a circumferential direction of the opening area | S140 |

| Dispose a barrier layer covering at least a surface of the separation layer facing away from the substrate in the transition area, a material of the barrier layer being a material for blocking moisture and oxygen | S150 |

| Dispose a display layer covering the planarization layer and the barrier layer, the display layer including a light-emitting layer, the light-emitting layer being discontinuous at a position of a sidewall of the separation layer | S160 |

FIG. 4

DISPLAY DEVICE, DISPLAY PANEL AND MANUFACTURING METHOD THEREOF

CROSS-REFERENCE TO RELATED APPLICATION

This application claims priority to Chinese Patent Application No. 201910600353.8, filed Jul. 4, 2019, the contents of which are incorporated by reference in their entirety herein.

TECHNICAL FIELD

The present disclosure relates to the field of display technology and, in particular, to a display device, a display panel, and a method for manufacturing a display panel.

BACKGROUND

For terminal devices, such as mobile phones and computers, it is often necessary to form openings in the display panel in order to dispose devices, such as cameras or sensors, in order to reduce the width of the edge of the display panel, and achieve narrow bezel or even a "bezel-less" appearance.

It should be noted that the information disclosed in the Background section above is only used to enhance the understanding of the background of the present disclosure, and therefore may include information that does not constitute the prior art known to those of ordinary skill in the art.

SUMMARY

The present disclosure provides a display device, a display panel, and a method for manufacturing a display panel.

According to an aspect of the present disclosure, a display panel is provided, including:

a substrate having a transition area, an opening area, and a display area, the opening area and the display area being disposed on both sides of the transition and being separated by the transition area;

a driving layer disposed on one side of the substrate and covering the transition area and the display area;

a planarization layer covering the driving layer;

a separation layer disposed on a surface of the planarization layer facing away from the substrate and located in an area of the transition area, and disposed at least partly around the opening area along a circumferential direction of the opening area, wherein a sidewall of the separation layer is gradually shrunk towards the substrate in a direction perpendicular to the substrate;

a barrier layer located in the transition area and covering at least a surface of the separation layer facing away from the substrate, wherein the barrier layer includes a material for blocking moisture and oxygen; and a display layer covering the planarization layer and the barrier layer, wherein the display layer includes a light-emitting layer, and the light-emitting layer is discontinuous at a position of a sidewall of the separation layer.

In an exemplary embodiment of the present disclosure, the separation layer and the planarization layer include a same material.

In an exemplary embodiment of the present disclosure, both of the separation layer and the planarization layer are formed of a negative photoresist.

In an exemplary embodiment of the present disclosure, the transition area is disposed around the opening area, and the display area is disposed around the transition area; and the separation layer is a ring structure surrounding the opening area, and the separation layer comprises multiple concentric layers.

In an exemplary embodiment of the present disclosure, the barrier layer includes at least one of silicon nitride and silicon carbide.

In an exemplary embodiment of the present disclosure, the substrate is flexible.

In an exemplary embodiment of the present disclosure, the driving layer includes:

an active layer disposed on one side of the substrate and located in the display area;

a gate insulating layer covering the active layer, and covering the display area and the transition area;

a gate disposed on a surface of the gate insulating layer facing away from the substrate and being directly aligned to the active layer;

an insulating layer covering the gate and the gate insulating layer;

a passivation layer covering the insulating layer; and a source and a drain disposed on a surface of the passivation layer facing away from the substrate, and connected to the active layer through via hole;

wherein the planarization layer is covered on the source, the drain, and the passivation layer, and the barrier layer and the passivation layer include a same material.

According to an aspect of the present disclosure, a method for manufacturing a display panel is provided, including:

providing a substrate having a transition area, an opening area, and a display area, the opening area and the display area being disposed on both sides of the transition and being separated by the transition area;

disposing a driving layer on one side of the substrate, the driving layer covering the opening area, the transition area, and the display area;

disposing a planarization layer covering the driving layer;

disposing a separation layer on a surface of the planarization layer facing away from the substrate and located in the transition area, wherein a sidewall of the separation layer gradually shrinks toward the substrate in a direction perpendicular to the substrate, and is disposed at least partly around the opening area along a circumferential direction of the opening area;

disposing a barrier layer covering at least a surface of the separation layer facing away from the substrate in the transition area, wherein the barrier layer includes a material for blocking moisture and oxygen; and disposing a display layer covering the planarization layer and the barrier layer, wherein the display layer includes a light-emitting layer, and the light-emitting layer is discontinuous at a position of a sidewall of the separation layer.

In an exemplary embodiment of the present disclosure, the separation layer and the planarization layer include a same material.

In an exemplary embodiment of the present disclosure, both of the separation layer and the planarization layer are formed of a negative photoresist.

In an exemplary embodiment of the present disclosure, the barrier layer includes at least one of silicon nitride and silicon carbide.

In an exemplary embodiment of the present disclosure, disposing of the separation layer on the surface of the planarization layer facing away from the substrate and located in the transition area includes:

disposing a negative photoresist layer on a surface of the planarization layer facing away from the substrate; and exposing and developing an area of the negative photoresist layer in the transition area to obtain the separation layer, wherein the sidewall of the separation layer is gradually shrunk toward the substrate in the direction perpendicular to the substrate, and is disposed at least partly around the opening area along the circumferential direction of the opening area.

In an exemplary embodiment of the present disclosure, the transition area is disposed around the opening area, and the display area is disposed around the transition area; and the separation layer is a ring structure surrounding the opening area, and the separation layer comprises multiple concentric layers.

According to an aspect of the present disclosure, there is provided a display device including the display panel according to any one of the above-mentioned aspects.

It should be understood that the above general description and the following detailed description are merely exemplary and explanatory, and should not limit the present disclosure.

BRIEF DESCRIPTION OF THE DRAWINGS

The drawings herein, which are incorporated in and constitute a part of this specification, illustrate embodiments consistent with the present disclosure, and together with the description serve to explain the principles of the present disclosure. Understandably, the drawings in the following description are just some embodiments of the present disclosure. For those of ordinary skill in the art, other drawings can be obtained based on these drawings without creative effort.

FIG. 3 is a schematic diagram of a separation layer of a display panel according to an embodiment of the present disclosure.

FIG. 4 is a flowchart of a manufacturing method according to an embodiment of the present disclosure.

DETAILED DESCRIPTION

Figure 1:
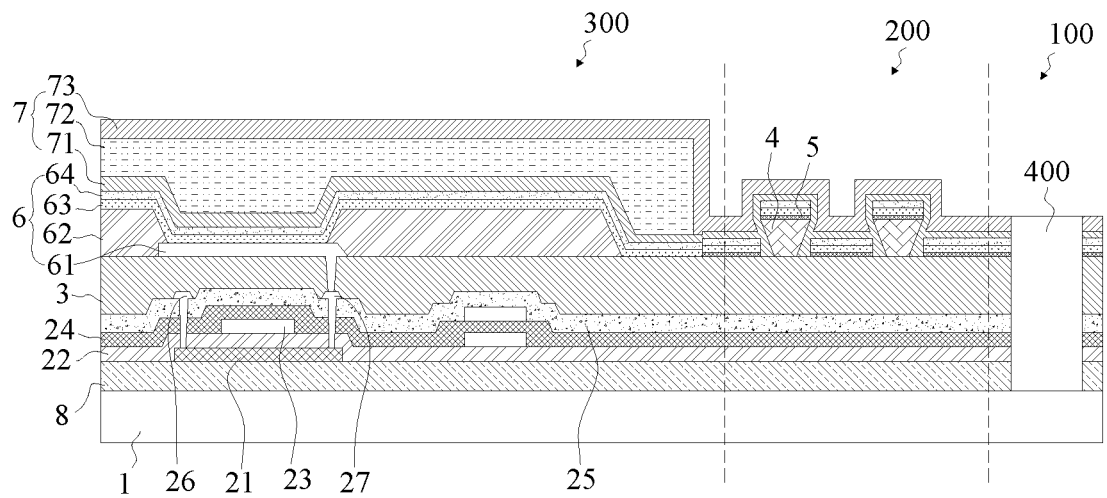
FIG. 1 is a partial cross-sectional view of a display panel according to an embodiment of the present disclosure.

Example embodiments will now be described more fully with reference to the accompanying drawings. However, the example embodiments can be implemented in various forms and should not be construed as limited to the embodiments set forth herein. Rather, these embodiments are provided so that this disclosure will be thorough and complete, and will fully convey the concept of the example embodiments to those skilled in the art. The same reference numerals in the drawings denote the same or similar structures, and thus their detailed descriptions will be omitted. In addition, the drawings are merely schematic illustrations of the present disclosure and are not necessarily drawn to scale.

Although relative terms are used in this specification, such as "up" and "down", to describe the relative relationship between one component of another icon and another component, these terms are used in this specification only for convenience, for example, according to a direction of the examples described. It can be understood that if the device of the icon is turned upside down and turned upside down, the component described above will become the component below. When a structure is "on" another structure, it may mean that a structure is integrally formed on another structure, or that a structure is "directly" disposed on another structure, or that a structure is "indirectly" disposed on another structure on other structures.

The terms "a", "an", "the", "said", and "at least one" are used to indicate the presence of one or more elements/components/etc. The terms "including" and "having" are used to indicate open-ended inclusion and mean that there may be additional elements/components/etc. in addition to the listed elements/components/etc. The terms "first" and "second" are used only as labels or markers, not as a limitation on the number of objects.

Figure 2:
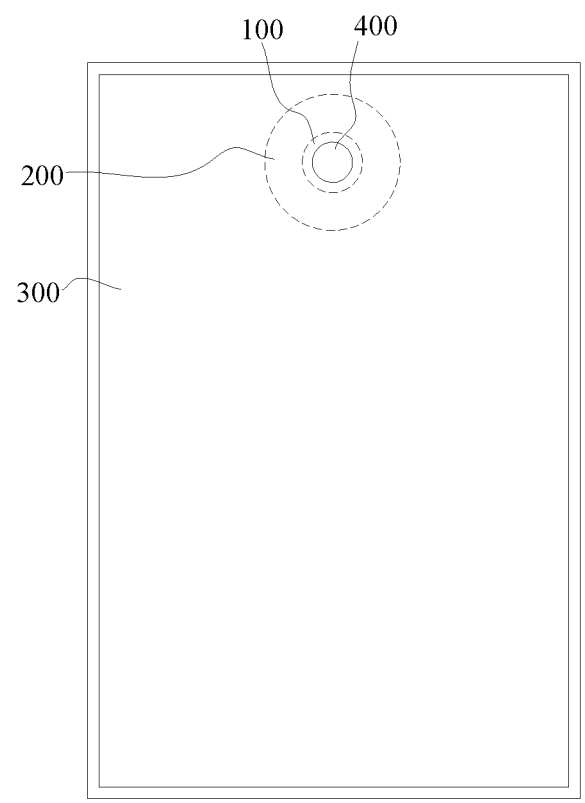
FIG. 2 is a schematic top view of a display panel according to an embodiment of the present disclosure.

An embodiment of the present disclosure provides a display panel. As shown in FIG. 1 and FIG. 2, the display panel includes a substrate 1, a driving layer 2, a planarization layer 3, a separation layer 4, a barrier layer 5, and a display layer 6, wherein:

the substrate 1 has an opening area 100, a transition area 200, and a display area 300. The transition area 200 is located between the opening area 100 and the display area 300, such that the opening area 100 and the display area 300 are separated by the transition area 200. The driving layer 2 is disposed on one side of the substrate 1 and covers the transition area 200 and the display area 300. The planarization layer 3 covers the driving layer 2.

The separation layer 4 is disposed on the surface of the planarization layer 3 facing away from the substrate 1 in the area of the transition area 200 and surrounds at least a part of the opening area 100 along the circumferential direction of the opening area 100. The sidewall of the separation layer 4 gradually shrinks toward the substrate 1 in a direction perpendicular to the substrate 1. The barrier layer 5 is located in the transition area 200 and covers at least the surface of the separation layer 4 facing away from the substrate 1, where the material of the barrier layer 5 is a material for blocking moisture and oxygen.

The display layer 6 covers the planarization layer 3 and the barrier layer 5. The display layer 6 includes a light-emitting layer 63. The light-emitting layer 63 is discontinuous at the sidewall of the separation layer 4. That is, as illustrated in FIG. 1, the light-emitting layer 63 terminates at the sidewall of the separation layer 4, and does not further extend along the direction towards the separation layer 4.

In the display panel of the present disclosure, on one hand, the separation layer 4 is located in the transition area 200, and surrounds at least a part of the opening area 100 along the circumferential direction of the opening area 100, and the sidewall of the separation layer 4 gradually shrinks toward the substrate 1 in a direction perpendicular to the substrate 1, so that the light-emitting layer 63 of the display layer 6 can be discontinued at the sidewall of the separation layer 4, which cut off the path of moisture and oxygen erosion and avoid causing erosion to the display device in the display area 300. On the other hand, the barrier layer 5 covers a surface of the separation layer 4 facing away from the substrate 1, which can separate the display layer 6 and the separation layer 4, prevent moisture and oxygen from entering the separation layer 4 from the display layer 6, prevent moisture and oxygen from entering the display area 300 through the separation layer 4, further cut off the path of moisture and oxygen erosion, and prevent moisture and oxygen from eroding the display device, thereby ensuring the display effect.

Respective parts of the display panel according to the embodiment of the present disclosure are described in detail below.

As shown in FIG. 1 and FIG. 2, the substrate 1 has an opening area 100, a transition area 200, and a display area 300. The opening area 100 is an area corresponding to the through hole 400 in the display panel, and the transition area 200 is located between the opening area 100 and the display area 300 and separates the opening area 100 and the display area 300.

For example, the transition area 200 is a circular area and surrounds the opening area 100, and the display area 300 surrounds the transition area 200 and is used for a "punched screen". Alternatively, the opening area 100 is an arc-shaped area, and its periphery is connected to the edge of the substrate 1. The transition area 200 may also be an arc-shaped area and surround the outside of the opening area 100 for a "water drop screen".

The substrate 1 may have a rigid material such as glass, or a flexible material such as PET (polyethylene terephthalate). The thickness and shape of the substrate 1 are specifically defined herein.

Figure 8:
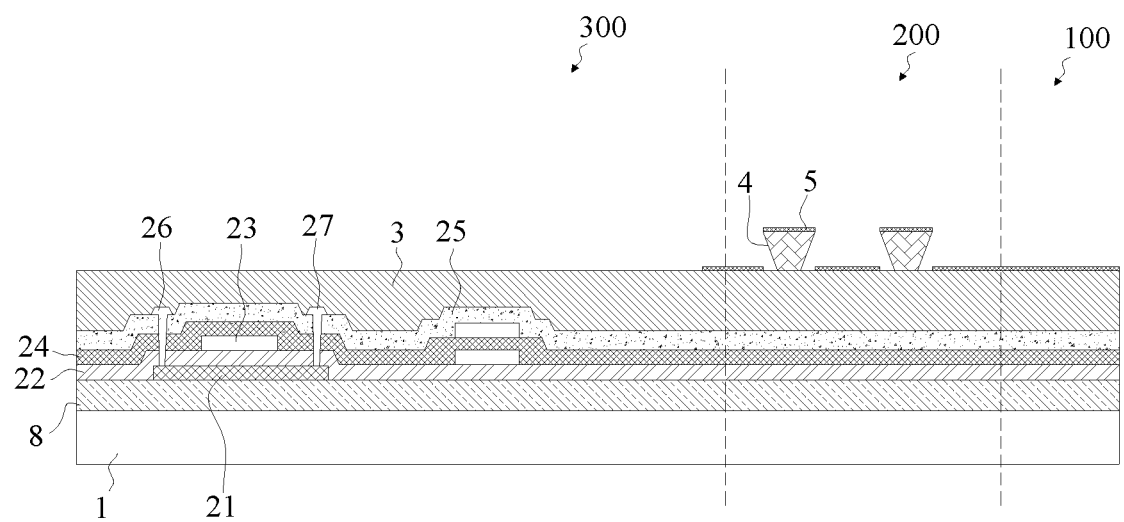
FIG. 8 is a schematic structural diagram corresponding to step S150 of the manufacturing method according to the embodiment of the present disclosure.

As shown in FIG. 1, the driving layer 2 is disposed on one side of the substrate 1 and covers the opening area 100, the transition area 200, and the display area 300, that is, the orthographic projection of the driving layer 2 on the substrate 1 covers the opening area 100, the transition area 200, and the display area 300. The driving layer 2 is used to drive the light-emitting layer 63 of the display layer 6 to emit light to display an image. The driving layer 2 may include a plurality of switching devices distributed in an array, and the switching devices may be thin film transistors. As shown in FIG. 1 and FIG. 8, in an embodiment, a switching device may be a top-gate thin film transistor as an example, and the driving layer 2 may include an active layer 21, a gate insulating layer 22, a gate 23, an insulating layer 24, a passivation layer 25, a source 26, and a drain 27.

The active layer 21 is disposed on one side of the substrate 1 and is located in the display area 300, where the active layer 21 includes a channel area, a first doped area, and a second doped area separated on both sides of the channel area.

The gate insulating layer 22 covers the active layer 21, and covers the display area 300 and the transition area 200.

The gate 23 is disposed on a surface of the gate insulating layer 22 facing away from the substrate 1 and is located in the display area 300.

The insulating layer 24 may cover the gate 23 and the gate insulating layer 22, a material thereof being a transparent insulating material.

The passivation layer 25 may cover the insulating layer 24, a material thereof being a transparent insulating material. A material of the passivation layer 25 may include at least one of silicon nitride and silicon carbide.

The source 26 and the drain 27 are disposed on a surface of the passivation layer 25 facing away from the substrate 1, the source 26 being connected to the first doped area through a first via hole passing through the insulating layer 24 and the passivation layer 25, and the drain being connected to the second doped area through a second via hole passing through the insulating layer 24 and the passivation layer 25.

As shown in FIG. 1, the planarization layer 3 covers the driving layer 2. For example, the planarization layer 3 covers the source 26, the drain 27, and the passivation layer 25 described above. The projection of the planarization layer 3 on the substrate 1 covers the transition area 200 and the display area 300. The surface of the planarization layer 3 facing away from the driving layer 2 is a plane. The material of the planarization layer 3 may be an organic material, such as a positive or negative photoresist, and the like is not listed here one by one.

As shown in FIG. 1, the display panel according to the embodiment of the present disclosure may further include a buffer layer 8. The buffer layer 8 is disposed on the substrate 1 and covers the opening area 100, the transition area 200, and the display area 300. The driving layer 2 may be disposed on a surface of the buffer layer 8 away from the substrate 1.

As shown in FIG. 1 and FIG. 3, the separation layer 4 is disposed on the surface of the planarization layer 3 facing away from the substrate 1 and is located in the transition area 200, and circumvents at least a part of the opening area 100 along the periphery of the opening area 100. For example, the transition area 200 is a ring-shaped area surrounding the opening area 100, and the separation layer 4 is also a ring-shaped structure surrounding the opening area 100. Alternatively, the separation layer 4 may also be an arc-shaped structure surrounding a part of the opening area 100.

The sidewall of the separation layer 4 gradually shrinks toward the substrate 1 in a direction perpendicular to the substrate 1, that is, the area of the surface where the separation layer 4 is in contact with the planarization layer 3 is smaller than the area of the surface facing away from the planarization layer 3. For example, the separation layer 4 is a ring-shaped or arc-shaped structure, and its cross-section gradually shrinks in a direction close to the substrate 1, and the cross-section is a cross-section perpendicular to the substrate 1. When the light-emitting layer 63 of the display layer 6 is disposed, the light-emitting layer 63 cannot cover the sidewall of the separation layer 4 and is disconnected at the position of the sidewall, so that moisture and oxygen cannot enter the display area 300 through the transition area 200 to prevent the display device from being erosion.

It should be noted that if the separation layer 4 has a ring structure, which may be a ring, a square ring, or an irregular ring structure, and its shape is specifically limited here.

The material of the separation layer 4 may be an organic material such as a photoresist. In order to improve the adhesion between the separation layer 4 and the planarization layer 3, the materials of the separation layer 4 and the planarization layer 3 may be the same. For example, the separation layer 4 and the planarization layer 3 are both photoresists. Further, the material of the separation layer 4 is a negative photoresist. During manufacture, a negative photoresist layer can be disposed first, and then exposed and developed according to the shape of the separation layer 4 by using a mask. The exposed area is the separation layer 4. Since the light intensity will gradually decrease toward the planarization layer 4 in a direction perpendicular to the substrate 1, the transverse base of the separation layer 4 can be gradually contracted toward the substrate 1, so that the separation layer 4 can be obtained by only exposing and developing, which is beneficial to simplifying the process.

As shown in FIG. 3, in an embodiment, the separation layer 4 may have a ring shape, and the number of the separation layer 4 is multiple, such as, two, three, and the like. The sizes of the respective separation layers 4 are different and are arranged separately and concentrically. Two adjacent separation layers 4 are arranged separately, that is, two adjacent separation layers 4 are not in contact.

As shown in FIG. 1, the barrier layer 5 is located in the transition area 200 and at least covers the surface of the separation layer 4 facing away from the substrate 1. The material of the barrier layer 5 is a moisture barrier material, which can prevent moisture and oxygen from penetrating into the separation layer 4 and prevent the display device from being erosion from passing through the separation layer 4 and the light-emitting layer 63 and further cut off the erosion path of moisture and oxygen. Further, the barrier layer 5 may also be located in the transition area 200 to cover the area of the planarization layer 3 that is not covered by the separation layer 4, and the barrier layer 5 is also discontinuous at the sidewall position of the separation layer 4.

The material of the barrier layer 5 includes at least one of silicon nitride and silicon carbide, and the material of the barrier layer 5 may be the same as that of the passivation layer 25 described above, so as to facilitate manufacturing by the same equipment to save costs.

As shown in FIG. 1, the display layer 6 covers the planarization layer 3 and the barrier layer 5. The display layer 6 includes a light-emitting layer 63. The light-emitting layer 63 is discontinuous at the sidewall of the separation layer 4, thereby preventing moisture and oxygen from entering the display area 300 along the light-emitting layer 63. Specifically, the display layer 6 covers the surface of the planarization layer 3 facing away from the substrate 1 in the display area 300, and the display layer 6 covers the surface of the barrier layer 5 facing away from the substrate 1 in the transition area 200.

In an embodiment, the display layer 6 may include a first electrode 61, a pixel defining layer 62, a light-emitting layer 63, and a second electrode 64.

The first electrode 61 is disposed on a surface of the planarization layer 3 facing away from the substrate 1. The first electrode 61 is located in the display area 300, and is connected to a plurality of switching devices in the driving layer 2. For example, the switching device in the driving layer 2 is the top-gate thin film transistor in the above embodiment, and the first electrode 61 and the drain 27 of the top-gate thin film transistor are connected through a via hole passing through the planarization layer 3.

The pixel defining layer 62 may cover a surface of the planarization layer 3 facing away from the substrate 1, and the pixel defining layer 62 has a pixel area exposing the first electrode 61.

The light-emitting layer 63 may be an organic light-emitting material, which covers the pixel defining layer 62 and the first electrode 61, extends to the transition area 200, covers the barrier layer 5, and is disconnected at the sidewall of the separation layer 4. For example, the light-emitting layer 63 may include a hole injection layer, a hole transport layer, an organic light-emitting layer, an electron transport layer, and an electron injection layer that are sequentially stacked on the first electrode 61.

The second electrode 64 may cover the light-emitting layer 63 and the separation layer 4, and the second electrode 64 is disconnected at the sidewall of the separation layer 4. The light-emitting layer 63 may be caused to emit light through the first electrode 61 and the second electrode 64. The specific light-emitting principle will not be described in detail herein.

The display panel of the present disclosure is further disposed with a through hole 400 that penetrates the driving layer 2 and the display layer 6 and is located in the opening area 100. Understandably, the through hole 400 can also penetrate the substrate 1. Components such as a camera module and a sensor may be disposed in the through hole 400, which is not particularly limited herein.

In addition, the display panel of the present disclosure further includes an encapsulation layer 7 that covers the display layer 6 and may cover the barrier layer 5. The encapsulation layer 7 may have a single-layer or multi-layer structure. For example, the encapsulation layer 7 may include a first inorganic layer 71, an organic layer 72, and a second inorganic layer 73.

The first inorganic layer 71 covers the display layer 6 and may cover the barrier layer 5 and may be disposed by a method such as vapor deposition. Therefore, the first inorganic layer 71 may cover the sidewall of the separation layer 4. The organic layer 72 is disposed on a surface of the first inorganic layer 71 facing away from the substrate 1 and is located in the display area 300. The organic layer 72 can absorb stress. The second inorganic layer 73 covers the organic layer 72 and the first inorganic layer 71, and covers the barrier layer 5. The second inorganic layer 73 is an inorganic material, and can also be prepared by a method such as vapor deposition so that the second inorganic layer 73 can cover the first inorganic layer 71 at the sidewall of the layer 4.

An embodiment of the present disclosure also provides a method for manufacturing a display panel. The display panel may include the display panel of the foregoing embodiment, and its structure is not described herein again. As shown in FIG. 4, the manufacturing method includes steps S110-S160.

In step S110, a substrate is provided, the substrate having a transition area, an opening area, and a display area separated on both sides of the transition area.

In step S120, a driving layer is disposed on one side of the substrate, the driving layer covering the opening region, the transition region, and the display region.

In step S130, a planarization layer is disposed and covers the driving layer.

In step S140, a separation layer is disposed on a surface of the planarization layer facing away from the substrate and located in the transition area, where a sidewall of the separation layer gradually shrinks toward the substrate in a direction perpendicular to the substrate, and surrounds at least a part of the opening area along a circumferential direction of the opening area.

In step S150, a barrier layer is disposed and covers at least a surface of the separation layer facing away from the substrate in the transition area, where a material of the barrier layer is a material for blocking moisture and oxygen.

In step S160, a display layer is disposed and covers the planarization layer and the barrier layer, where the display layer includes a light-emitting layer, and the light-emitting layer is discontinuous at a position of a sidewall of the separation layer.

For the beneficial effects of the manufacturing method of the present disclosure, reference may be made to the beneficial effects of the display panel described above, and details are not repeated herein. Each step of the manufacturing method according to the embodiment of the present disclosure is described below.

In steps S110, S120, and S130, the specific structures of the substrate 1, the driving layer 2, and the planarization layer 3 have been described in detail in the above embodiment of the display panel, and are not repeated here.

In an embodiment, a driving layer is disposed on one side of the substrate, that is, step S120 includes steps S1210 to S1260.

In step S1210, an active layer is disposed on one side of the substrate, and the active layer is located in the display area.

In step S1220, a gate insulation layer, covering the active layer, is disposed and the gate insulation layer covers the display area and the transition area.

In step S1230, a gate is disposed on a surface of the gate insulating layer facing away from the substrate and is directly aligned to the active layer.

In step S1240, an insulating layer, covering the gate and the gate insulating layer, is disposed.

In step S1250, a source and a drain are disposed on a surface of the passivation layer facing away from the substrate, and connected to the active layer through via hole.

In step S1260, a passivation layer, covering the insulating layer, is disposed and a material of the barrier layer and a material of the passivation layer are same.

The specific structures of the above-mentioned active layer, gate insulating layer, gate, insulating layer, passivation layer, source, and drain have been described in detail in the above embodiment of the display panel, and are not repeated here.

In step S140, a separation layer is disposed in an area of the surface of the planarization layer facing away from the substrate in the transition area, and the sidewall of the separation layer gradually shrinks toward the substrate in a direction perpendicular to the substrate and surrounds at least a part of the opening area along the circumferential direction of the opening area.

Figure 5:
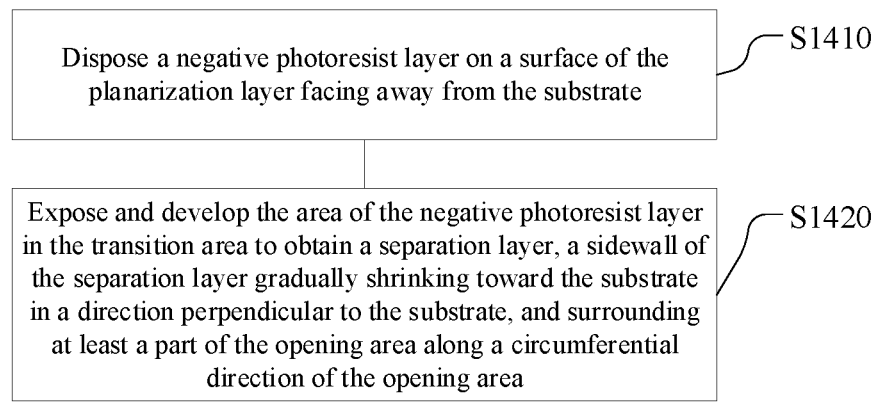
FIG. 5 is a flowchart of step S140 of the manufacturing method according to the embodiment of the present disclosure.
Figure 6:
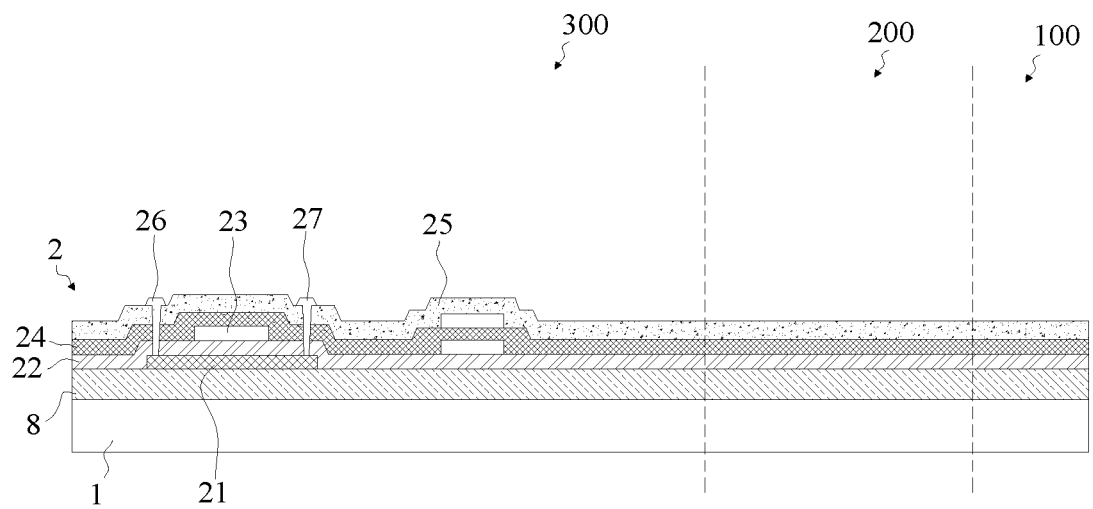
FIG. 6 is a schematic structural diagram corresponding to step S120 of the manufacturing method according to the embodiment of the present disclosure.

As shown in FIG. 5, in an embodiment, the material of the separation layer is a negative photoresist. In step S140, the separation layer is disposed in an area of the surface of the planarization layer facing away from the substrate and is located in the transition area, including step S1410 and step S1420.

In step S1410, a negative photoresist layer is disposed on a surface of the planarization layer facing away from the substrate.

The negative photoresist layer can be disposed on the surface of the planarization layer facing away from the substrate 1 by a process such as spin coating.

In step S1420, the area of the negative photoresist layer in the transition area are exposed and developed to obtain the separation layer, wherein a sidewall of the separation layer gradually shrinks toward the substrate in the direction perpendicular to the substrate, and surrounds at least a part of the opening area along the circumferential direction of the opening area.

Figure 7:
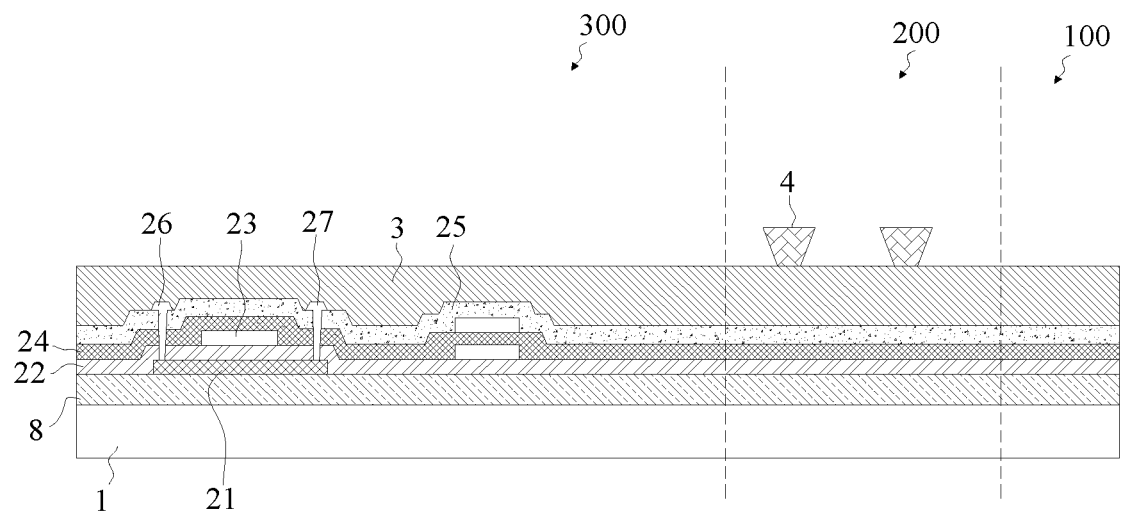
FIG. 7 is a schematic structural diagram corresponding to step S140 of the manufacturing method according to the embodiment of the present disclosure.

As shown in FIG. 7, a mask having a pattern of the separation layer 4 may be used. The negative photoresist layer is exposed from the side facing away from the substrate 1, and in the direction toward the substrate 1, the light entering the negative photoresist layer is gradually reduced, so that the degree of illumination is gradually reduced, and the degree of exposure is gradually reduced. After development, the separation layer 4 can be formed, and the degree of exposure can be reduced, so that the cross-section of the separation layer 4 can gradually shrink toward the substrate 1, that is, the distance between the two sidewalls of the separation layer 4 is gradually reduced.

Of course, the separation layer 4 can also be disposed by other processes, for example, a sacrificial layer having a groove is disposed on the planarization layer 3, and the formation of the groove is matched with the separation layer 4. The material of the separation layer 4 is filled in the groove and then the sacrifice layer is removed to obtain the separation layer 4. The formation processes of the separation layers 4 are not listed herein one by one.

In step S150, a barrier layer covering at least the surface of the separation layer facing away from the substrate is disposed in the transition area, and a material of the barrier layer is a moisture blocking material.

As shown in FIG. 8, for the specific structure of the barrier layer 5, reference may be made to the barrier layer 5 in the display panel above, which is not described in detail here. The barrier layer 5 may be disposed by a mask process, and the material of the barrier layer 5 includes at least one of silicon nitride and silicon carbide, and the material of the barrier layer 5 may be the same as that of the passivation layer 25 described above, so as to facilitate manufacturing by the same equipment, to save costs.

In addition, for a display panel having a through hole, the manufacturing method of the present disclosure may further include:

opening a through hole in an area on the display layer corresponding to the opening area, where the through hole penetrates the display layer and the driving layer.

The manufacturing method of the present disclosure may further include:

disposing an encapsulation layer to cover the display layer and the barrier layer.

As shown in FIG. 1, for the structure of the encapsulation layer 7, reference may be made to the encapsulation layer in the foregoing embodiment of the display panel, and details are not described herein again.

It should be noted that although the steps of the method in the present disclosure are described in a specific order in the drawings, however, this is not required or implied that the steps must be performed in this particular order, or that all steps shown must be performed to achieve the desired result. Additionally or alternatively, certain steps may be omitted, multiple steps may be combined into one step for execution, and/or one step may be split into multiple steps for execution, and so on.

An embodiment of the present disclosure further provides a display device. The display device may include the display panel of the foregoing embodiment. The structure of the display panel is not described herein again. The display device can be used or implemented in a mobile phone, a tablet computer, or other electronic devices, and will not be enumerated here. Meanwhile, for the beneficial effects of the display device, reference may be made to the beneficial effects of the display panel in the foregoing embodiments, and details are not described herein.

In the display device, the display panel, and the manufacturing method of the display panel of the present disclosure, on the one hand, the separation layer is located in the transition area, and surrounds at least a part of the opening area along the circumferential direction of the opening area, and the sidewall of the separation layer gradually shrinks toward the substrate in a direction perpendicular to the substrate, so that the light-emitting layer of the display layer can be discontinued at the sidewall of the separation layer, which cut off the path of moisture and oxygen erosion and avoid causing erosion to the display device in the display area. On the other hand, the barrier layer covers a surface of the separation layer facing away from the substrate, which can separate the display layer and the separation layer, prevent moisture and oxygen from entering the separation layer from the display layer, prevent moisture and oxygen from entering the display area through the separation layer, and further cut off the path of moisture and oxygen erosion, and prevent moisture and oxygen from eroding the display device, thereby ensuring the display effect.

Those skilled in the art will readily contemplate other embodiments of the present disclosure after considering the specification and practicing the invention disclosed herein. This application is intended to cover any variations, uses, or adaptations of this disclosure that conform to the general principles of this disclosure and include the common general knowledge or conventional technical means in the technical field not disclosed by this disclosure. It is intended that the specification and examples be considered as exemplary only, with a true scope and spirit of the disclosure being indicated by the following claims.

What is claimed is:

1. A display panel, comprising:
   a substrate having a transition area, an opening area, and a display area, the opening area and the display area being disposed on both sides of the transition and being separated by the transition area;
   a driving layer disposed on one side of the substrate and covering the transition area and the display area;
   a planarization layer covering the driving layer;
   a separation layer disposed on a surface of the planarization layer facing away from the substrate and located in an area of the transition area, and disposed at least partly around the opening area along a circumferential direction of the opening area, wherein a sidewall of the separation layer is gradually shrunk toward the substrate in a direction perpendicular to the substrate;
   a barrier layer located in the transition area and covering at least a surface of the separation layer facing away from the substrate, wherein the barrier layer comprises a material for blocking moisture and oxygen; and
   a display layer covering the planarization layer and the barrier layer, wherein the display layer comprises a light-emitting layer and the light-emitting layer is discontinuous at a position of a sidewall of the separation layer.

2. The display panel according to claim 1, wherein the separation layer and the planarization layer comprise a same material.

3. The display panel according to claim 2, wherein both of the separation layer and the planarization layer are formed of a negative photoresist.

4. The display panel according to claim 1, wherein:
   the transition area is disposed around the opening area;
   the display area is disposed around the transition area;
   the separation layer has a ring structure surrounding the opening area; and
   the separation layer comprises multiple concentric layers.

5. The display panel according to claim 1, wherein the barrier layer comprises at least one of silicon nitride and silicon carbide.

6. The display panel according to claim 1, wherein the substrate is flexible.

7. The display panel according to claim 1, wherein the driving layer comprises:
   an active layer disposed on one side of the substrate and located in the display area;
   a gate insulating layer covering the active layer, and covering the display area and the transition area;
   a gate disposed on a surface of the gate insulating layer facing away from the substrate and being directly aligned to the active layer;
   an insulating layer covering the gate and the gate insulating layer;
   a passivation layer covering the insulating layer; and
   a source and a drain disposed on a surface of the passivation layer facing away from the substrate, and connected to the active layer through via holes;
   wherein the planarization layer is covered on the source, the drain, and the passivation layer, and the barrier layer and the passivation layer comprise a same material.

8. A method for manufacturing a display panel, comprising:
   providing a substrate having a transition area, an opening area, and a display area, the opening area and the display area being disposed on both sides of the transition and being separated by the transition area;
   disposing a driving layer on one side of the substrate, the driving layer covering the opening area, the transition area, and the display area;
   disposing a planarization layer covering the driving layer;
   disposing a separation layer on a surface of the planarization layer facing away from the substrate and located in the transition area, wherein a sidewall of the separation layer is gradually shrunk toward the substrate in a direction perpendicular to the substrate, and is disposed at least partly around the opening area along a circumferential direction of the opening area;
   disposing a barrier layer covering at least a surface of the separation layer facing away from the substrate in the transition area, wherein the barrier layer comprises a material for blocking moisture and oxygen; and
   disposing a display layer covering the planarization layer and the barrier layer, wherein the display layer comprises a light-emitting layer, and the light-emitting layer is discontinuous at a position of a sidewall of the separation layer.

9. The method according to claim 8, wherein the separation layer and the planarization layer comprise a same material.

10. The method according to claim 9, wherein both of the separation layer and the planarization layer are formed of a negative photoresist.

11. The method according to claim 8, wherein the barrier layer comprises at least one of silicon nitride and silicon carbide.

12. The method according to claim 8, wherein disposing the separation layer on the surface of the planarization layer facing away from the substrate and located in the transition area comprises:
   disposing a negative photoresist layer on a surface of the planarization layer facing away from the substrate; and
   exposing and developing an area of the negative photoresist layer in the transition area to obtain the separation layer, wherein the sidewall of the separation layer is gradually shrunk toward the substrate in the direction perpendicular to the substrate, and is disposed at least partly around the opening area along the circumferential direction of the opening area.

13. The method according to claim 8, wherein:
   the transition area is disposed around the opening area, and the display area is disposed around the transition area; and
   the separation layer has a ring structure surrounding the opening area, and the separation layer comprises multiple concentric layers.

14. A display device, comprising:
   a display panel, the display panel comprising:
      a substrate having a transition area, an opening area, and a display area, the opening area and the display area being disposed on both sides of the transition area and being separated by the transition area;

a driving layer disposed on one side of the substrate and covering the transition area and the display area;

a planarization layer covering the driving layer;

a separation layer disposed on a surface of the planarization layer facing away from the substrate and located in an area of the transition area, and disposed at least partly around the opening area along a circumferential direction of the opening area, wherein a sidewall of the separation layer is gradually shrunk toward the substrate in a direction perpendicular to the substrate;

a barrier layer located in the transition area and covering at least a surface of the separation layer facing away from the substrate, wherein the barrier layer comprises a material for blocking moisture and oxygen; and a display layer covering the planarization layer and the barrier layer, wherein the display layer comprises a light-emitting layer, and the light-emitting layer is discontinuous at a position of a sidewall of the separation layer.

15. The display device according to claim 14, wherein the separation layer and the planarization layer comprise a same material.

16. The display device according to claim 15, wherein both of the separation layer and the planarization layer are formed of a negative photoresist.

17. The display device according to claim 14, wherein:
the transition area is disposed around the opening area, and the display area is disposed around the transition area; and
the separation layer has a ring structure surrounding the opening area, and the separation layer comprises multiple concentric layers.

18. The display device according to claim 14, wherein the barrier layer comprises at least one of silicon nitride and silicon carbide.

19. The display device according to claim 14, wherein the substrate is flexible.

20. The display device according to claim 14, wherein, the driving layer comprises:
an active layer disposed on one side of the substrate and located in the display area;
a gate insulating layer covering the active layer, and covering the display area and the transition area;
a gate disposed on a surface of the gate insulating layer facing away from the substrate and being directly aligned to the active layer;
an insulating layer covering the gate and the gate insulating layer;
a passivation layer covering the insulating layer; and
a source and a drain disposed on a surface of the passivation layer facing away from the substrate, and connected to the active layer through via holes;
wherein the planarization layer is covered on the source, the drain, and the passivation layer, and the barrier layer and the passivation layer comprise a same material.

* * * * *